(12) United States Patent
Mansuri et al.

(10) Patent No.: US 9,786,353 B2
(45) Date of Patent: Oct. 10, 2017

(54) RECONFIGURABLE CLOCKING ARCHITECTURE

(71) Applicant: Intel Corporation, Santa Clara, CA (US)

(72) Inventors: Mozhgan Mansuri, Hillsboro, OR (US); Aaron Martin, El Dorado Hills, CA (US); James A. McCall, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/047,427

(22) Filed: Feb. 18, 2016

(65) Prior Publication Data

US 2017/0243627 A1    Aug. 24, 2017

(51) Int. Cl.
| | |
|---|---|
| *G11C 7/00* | (2006.01) |
| *G11C 11/4076* | (2006.01) |
| *H03K 5/14* | (2014.01) |
| *G11C 7/22* | (2006.01) |
| *G11C 7/10* | (2006.01) |
| *G06F 1/10* | (2006.01) |
| *H04L 7/033* | (2006.01) |
| *H03K 5/00* | (2006.01) |

(52) U.S. Cl.
CPC .......... *G11C 11/4076* (2013.01); *G06F 1/10* (2013.01); *G11C 7/10* (2013.01); *G11C 7/1087* (2013.01); *G11C 7/222* (2013.01); *H03K 5/14* (2013.01); *H04L 7/0337* (2013.01); *H03K 2005/00052* (2013.01)

(58) Field of Classification Search
CPC ..... G11C 11/4076; G11C 7/222; G11C 7/087; G11C 7/10; H03K 5/14; H03L 7/0814; H04L 7/0337; G06F 1/10
See application file for complete search history.

(56) References Cited

U.S. PATENT DOCUMENTS

| | | |
|---|---|---|
| 5,815,016 A | 9/1998 | Erickson |
| 6,963,250 B2 | 11/2005 | Ngo |
| 7,643,359 B2 | 1/2010 | Lee |

(Continued)

OTHER PUBLICATIONS

International Search Report and Written Opinion of International Patent Application No. PCT/US2017/013799, dated May 2, 2017.

*Primary Examiner* — Toan Le
(74) *Attorney, Agent, or Firm* — Green, Howard & Mughal LLP

(57) ABSTRACT

Described is an apparatus which comprises: a comparator to be clocked by a clock signal to be provided by a clocking circuit, wherein the clocking circuit includes: a voltage controlled delay line having two or more delay cells; a multiplexer coupled to the voltage controlled delay line and operable to configure the clocking circuit as a ring oscillator with the voltage controlled delay line forming at least one delay section of the ring oscillator; and select logic coupled to the multiplexer, the select logic is to receive a signal indicating arrival of an input clock, and is to control the multiplexer according to the indication. Described is also an apparatus which comprises: a data path to receive input data; and a clock path to receive an input clock and to provide a preconditioned clock to the data path when the input clock is absent.

24 Claims, 7 Drawing Sheets

(56) References Cited

U.S. PATENT DOCUMENTS

| | | | |
|---|---|---|---|
| 7,970,089 B2* | 6/2011 | Best | G06F 1/10 |
| | | | 327/161 |
| 9,209,821 B2 | 12/2015 | Bichan | |
| 9,246,666 B2* | 1/2016 | Kil | H04L 7/033 |
| 9,628,094 B2* | 4/2017 | Lotfy | H03L 7/105 |
| 2001/0011913 A1 | 8/2001 | Sher | |
| 2010/0091537 A1* | 4/2010 | Best | G11C 5/02 |
| | | | 365/51 |
| 2012/0166863 A1* | 6/2012 | Best | G06F 1/10 |
| | | | 713/503 |
| 2013/0187708 A1* | 7/2013 | Dang | H04L 25/4902 |
| | | | 329/312 |
| 2013/0250148 A1* | 9/2013 | Park | H04N 5/365 |
| | | | 348/241 |
| 2016/0254733 A1* | 9/2016 | Niccolini | H02K 15/064 |

* cited by examiner

RECONFIGURABLE CLOCKING ARCHITECTURE

BACKGROUND

For read operations, matched receiver (RX) architectures are conventionally used in DDR (Double Data Rate) controllers where the delay between data path (DQ) and read strobe path (DQS) are matched. As memory data rate increases, the bandwidth of the DQ path becomes a bottleneck. An unmatched sensitive RX architecture (e.g., Strongarm latch) can mitigate some of the bottleneck, but adds to read latency. In an unmatched RX architecture, the DQ and DQS paths are not matched.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
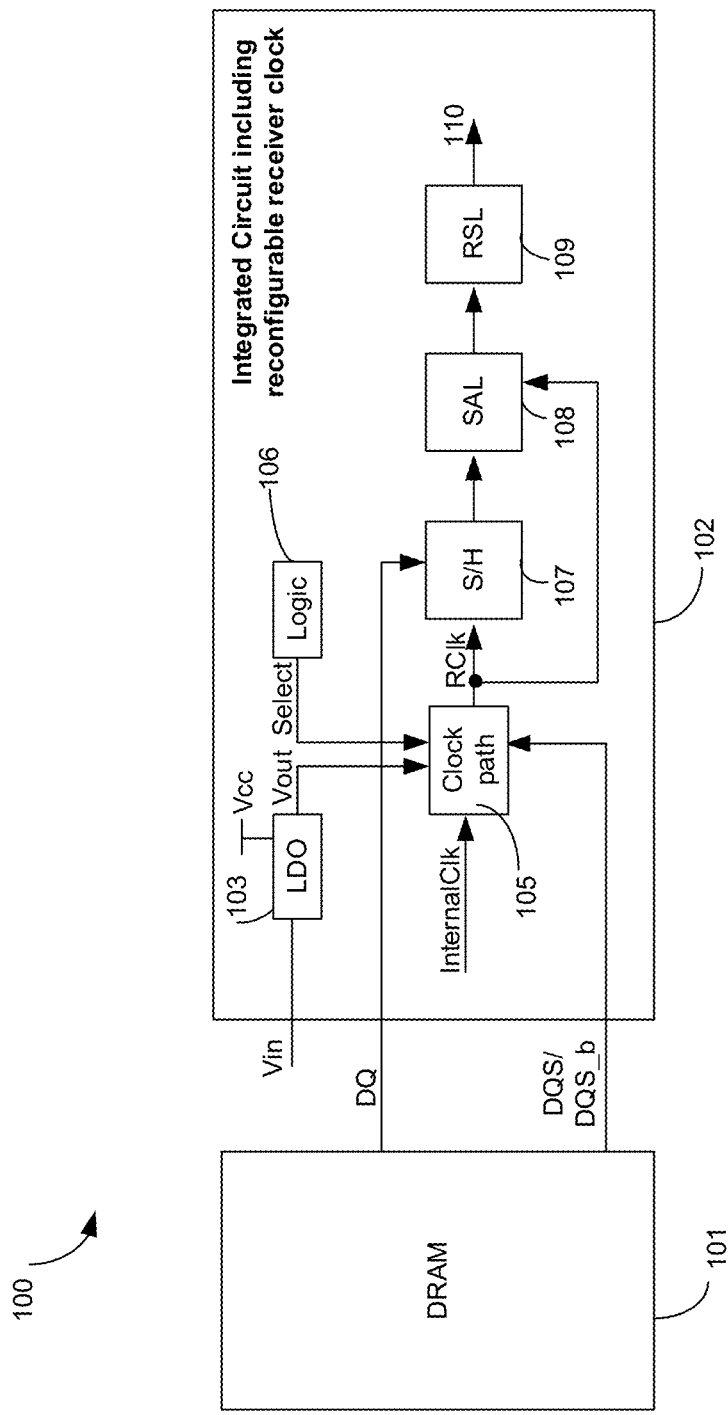
FIG. 1 illustrates a memory system with a reconfigurable clocking architecture for a receiver (RX), according to some embodiments of the disclosure.

An unmatched sensitive receiver (RX) samples and recovers low-swing data signal (e.g., DQ signal) with better power and area efficiency than matched RX architecture. Here, the term "matched" generally refers to matching of propagation delay paths between clock and data paths. For example, in a matched sensitive RX, signals on the data path and the clock path have the same propagation delay. An unmatched RX is an RX where the propagation delay of the data path is not the same as the propagation delay for the clock/strobe path. For example, the clock path may have longer propagation delay than the data path. Longer clock/strobe path (e.g., DQS path) versus data path (e.g., DQ path) may entail that a preamble data be sent along the data path until the RX clock is ready to sample the actual DQ signal (i.e., non-preamble data signal). Here, RX clock is the clock which is generally derived from DQS and is used for sampling DQ. Sending preamble data adds to read latency, which degrades read performance.

Some embodiments describe a reconfigurable RX clock to reduce the preamble length and thus mitigating the "read" latency. In some embodiments, in the time interval that the clock or strobe signal DQS is expected (but is still absent) at the boundary of the receiver, the RX clock (which is derived from the clock DQS) is generated by an oscillator (e.g., a voltage-controlled oscillator) which prepares the RX clock path. In some embodiments, upon clock or strobe signal DQS arrival, the RX clock is generated by a voltage-controlled delay (VCDL) path. The VCDL path is to be driven by DQS signal to take advantage of DQ-DQS jitter tracking of a source-synchronous system, in accordance with some embodiments. In some embodiments, the reconfigurable RX clock is slaved off a transmitter (TX) delay-locked loop (DLL) clock. For example, the propagation delay of the VCDL path is controlled by a control voltage (Vctl) generated by the TX.

There are many technical effects of the various embodiments. For example, some embodiments, enable an unmatched RX architecture without incurring read latency due to data preamble (to compensate for longer DQS vs DQ delay path). In some embodiments, the alternative clock (e.g., clock provided by an oscillator or another source) which is provided to the RX clock path when DQS is absent, allows to precondition the RX clock path.

For example, a voltage regulator such as a low dropout (LDO) voltage regulator that provides power to the RX clock path may be settling to a stable or steady state after being powered up when DQS is absent. If the clock path has no clock (because DQS is absent) then the LDO voltage regulator may not have the proper drive setting because the clock path has low or zero activity resulting in low emulation of loading conditions. In some embodiments, the preconditioning of the RX clock path by a clock provided by an oscillator or another source allows the LDO voltage regulator to adjust its drive strength to a more realistic clock path loading condition when DQS is absent. As such, when DQS actually arrives at the receiver end, the RX clock path is ready to sample data DQ because the RX clock path has been preconditioned.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical or magnetic connection between the things that are connected, without any intermediary devices. The term "coupled" means either a direct electrical or magnetic connection between the things that are connected or an indirect connection through one or more passive or active intermediary devices. The term "circuit" means one or more passive and/or active components that are arranged to cooperate with one another to provide a desired function. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic or ferroelectric FET devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates memory system 100 with a reconfigurable clocking architecture for a receiver, according to some embodiments of the disclosure. In some embodiments, memory system 100 comprises memory unit 101 and an integrated circuit (IC) 102 including a reconfigurable receiver. IC 102 may be a processor, a memory controller, or part of a system-on-chip (SoC). So as not to obscure the various embodiments, relevant portions of IC 102 are shown. A person skilled in the art would appreciate that other components such as transmitter, buffers, drivers, phase locked loops (PLLs), delay locked loops (DLLs), etc. are not shown but may be needed to realize a complete IC 102.

The various embodiments described here consider the memory 101 to be a Dynamic Random Access Memory (DRAM) which interfaces with IC 102 via a Double Data Rate (DDR) compliant interface such as Low Power Double Data Rate 4 (LPDDR4) interface described by JESD209-4A standard defined by Joint Electron Device Engineering Council (JEDEC) Solid State Technology Association in November 2015. However, the embodiments are not limited to DRAM and DDR interfaces, and can be extended to any receiver architecture that would benefit from preconditioning of a clocking path prior to arrival of a real sampling clock.

In some embodiments, IC 102 includes an integrated linear voltage regulator 103, Clock path 105, Logic 106, sample-and-hold (S/H) circuit 107, Strong-Arm latch (SAL) 108, and Reset-Set latch (RSL) 109. Here, S/H circuit 107, SAL 108, and RSL 109 are part of the data path that receives data signal DQ and generates a sampled output 110 for processing by other logic (not shown) in IC 102.

In some embodiments, any passive components such as inductor or capacitor associated with converter 103 are positioned on a package encasing IC 102. In some embodiments, the passive components (not shown) associated with converter 103 are on-die components which are part of IC 102. Any known linear regulator may be used for converter 103 that can reject supply noise on RX clock path and improve clock jitter. In some embodiments, the converter is a low dropout (LDO) regulator 103 that receives input power supply Vin and generates an output power supply Vout. Any known LDO regulator design may be used for implementing LDO 103.

In some embodiments, IC 102 comprises Clock path 105. In some embodiments, Clock path 105 is a reconfigurable clock path which is operable to provide a preconditioned clock as RClk for S/H circuit 107 and SAL 108 when Logic 106 indicates that DQS/DQS_b are absent. The preconditioned clock reduces read latency because relevant circuits (e.g., LDO 103, Clock path 105, etc.) are ready and/or trained when real clock (e.g., DQS/DQS_b) arrives to sample data DQ.

In some embodiments, in the time interval that the clock or strobe signal DQS is expected (but still absent) at the boundary of IC 102, RClk (which is generally derived from the clock DQS/DQS_b) is generated by an oscillator (e.g., a voltage-controlled oscillator) which prepares the RX clock path (e.g., part of Clock path 105). In some embodiments, the arrival of clock DQS/DQS_b is indicated by Select signal generated by Logic 106. For example, when Select signal is logical high, Clock path 105 is informed that clock DQS/DQS_b is about to arrive (i.e., it is currently absent) and so Clock path 105 should precondition RClk.

In some embodiments, in the time interval that the clock or strobe signal DQS is expected (but still absent) at the boundary of IC 102, RClk is generated by InternalClk (e.g., a bypass clock signal or an internal clock signal). For example, InternalClk is buffered by Clock path 105 as RClk. In some embodiments, InternalClk may be generated locally on IC 102 from TX DLL (delay locked loop) clock. In some embodiments, upon clock or strobe signal DQS arrival, RClk is generated by a VCDL path in Clock path 105. The VCDL path is to be driven by DQS signal to take advantage of DQ-DQS jitter tracking of a source-synchronous system, in accordance with some embodiments.

In some embodiments, S/H circuit 107 samples input data DQ by a rising or falling edge of RClk. In some embodiments, S/H circuit 107 receives data DQ and uses different phases of RClk to sample the data. In some embodiments, the different phases of a clock are used in an interleaving RX to reduce clock frequency. For example, S/H circuit 107 uses RClk 0° phase to sample "even" DQ and RClk 180° phase to sample "odd" DQ. The data DQ can be single ended or differential. Any known suitable S/H circuit may be used to implement S/H circuit 107. In some embodiments, output of S/H circuit 107 is latched by SAL 108 using RClk. In some embodiments, SAL 108 is implemented as a clocked comparator. Any known suitable clocked comparator may be used to implement SAL 108. In some embodiments, the output of SAL 108 is latched by RSL 109 to provide sampled output 110. Any known suitable set-reset latch may be used to for implementing RSL 109.

Figure 2:
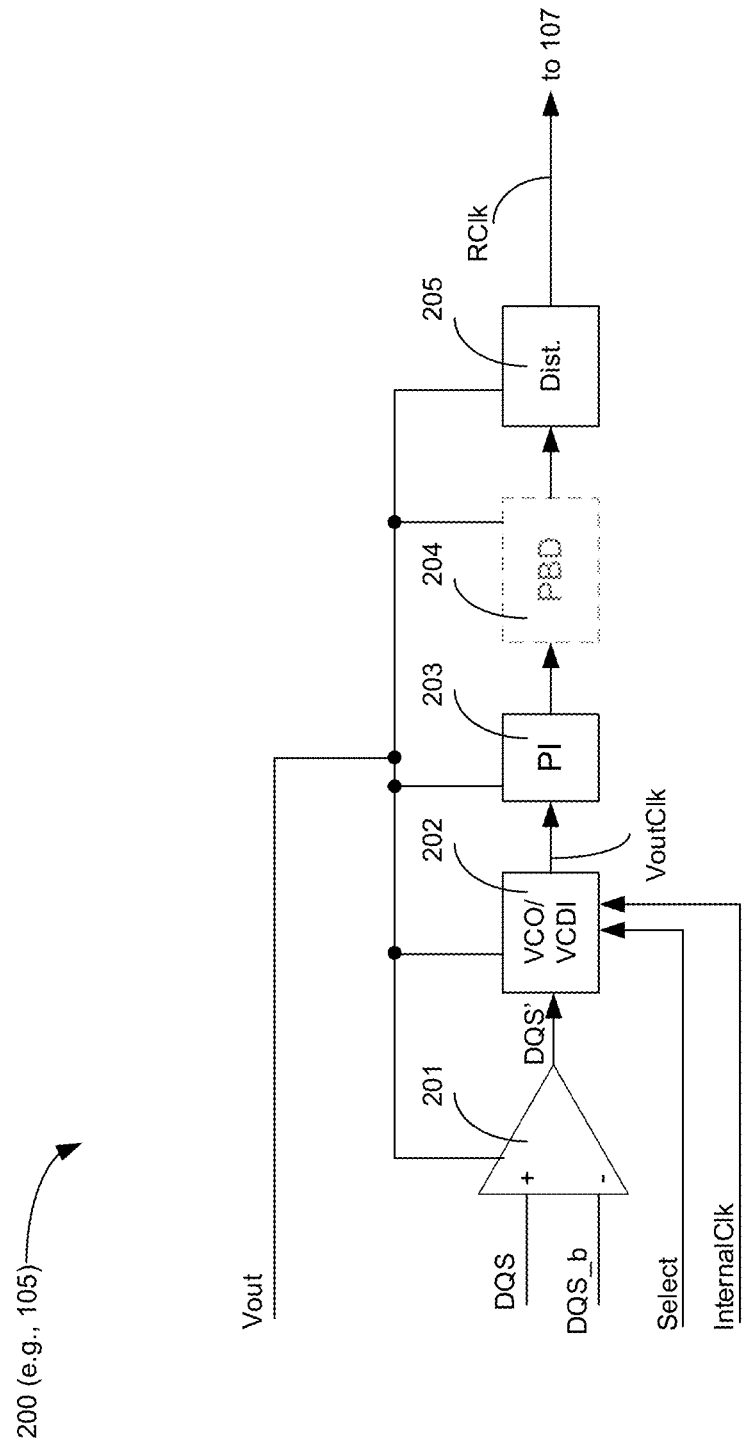
FIG. 2 illustrates a clocking path of the RX, according to some embodiments of the disclosure.

FIG. 2 illustrates clocking path 200/105 of receiver 102, according to some embodiments of the disclosure. It is pointed out that those elements of FIG. 2 having the same reference numbers (or names) as the elements of any other figure can operate or function in any manner similar to that described, but are not limited to such.

In some embodiments, clocking path 200/105 comprises differential amplifier 201, oscillator/delay-line 202, phase interpolator (PI) 203, clock distribution 205. In some embodiments, per-bit skewing (PBS) logic 204 is part of clocking path 200/105. In some embodiments, differential amplifier 201 receives low swing differential clock or strobe DQS'/DQS'_b from memory 101 and generates high swing or amplified differential output for oscillator/delay-line 202.

In some embodiments, oscillator/delay-line 202 receives Select signal from Logic 106 that informs oscillator/delay-line 202 whether DQS/DQS_b are present. Depending on that indication, oscillator/delay-line 202 may generate a preconditioned VcoClk, use InternalClk, or a regular clock which is derived from DQS/DQS_b. In some embodiments, oscillator/delay-line 202 is powered by Vout which is provided by LDO 103.

In some embodiments, clocking path 200/105 prepares/ preconditions the DQS path before DQS arrival and thus, reduces data preamble and read latency. For example, the clock path 200/105 is activated (e.g., before DQS clock arrives, the clock path 200/105 provides a toggling clock). This prepares the clock path 200/105 (with or without LDO 103) and the clock path source of clock can be switched to DQS as soon as DQS arrives. In some embodiments, PI 203, PBD 204, and clock distribution 205 are also powered by Vout. By using Vout for the clocking path 200/105, the clock performance improves as LDO filters supply noise and provides low-noise Vout.

Figure 3:
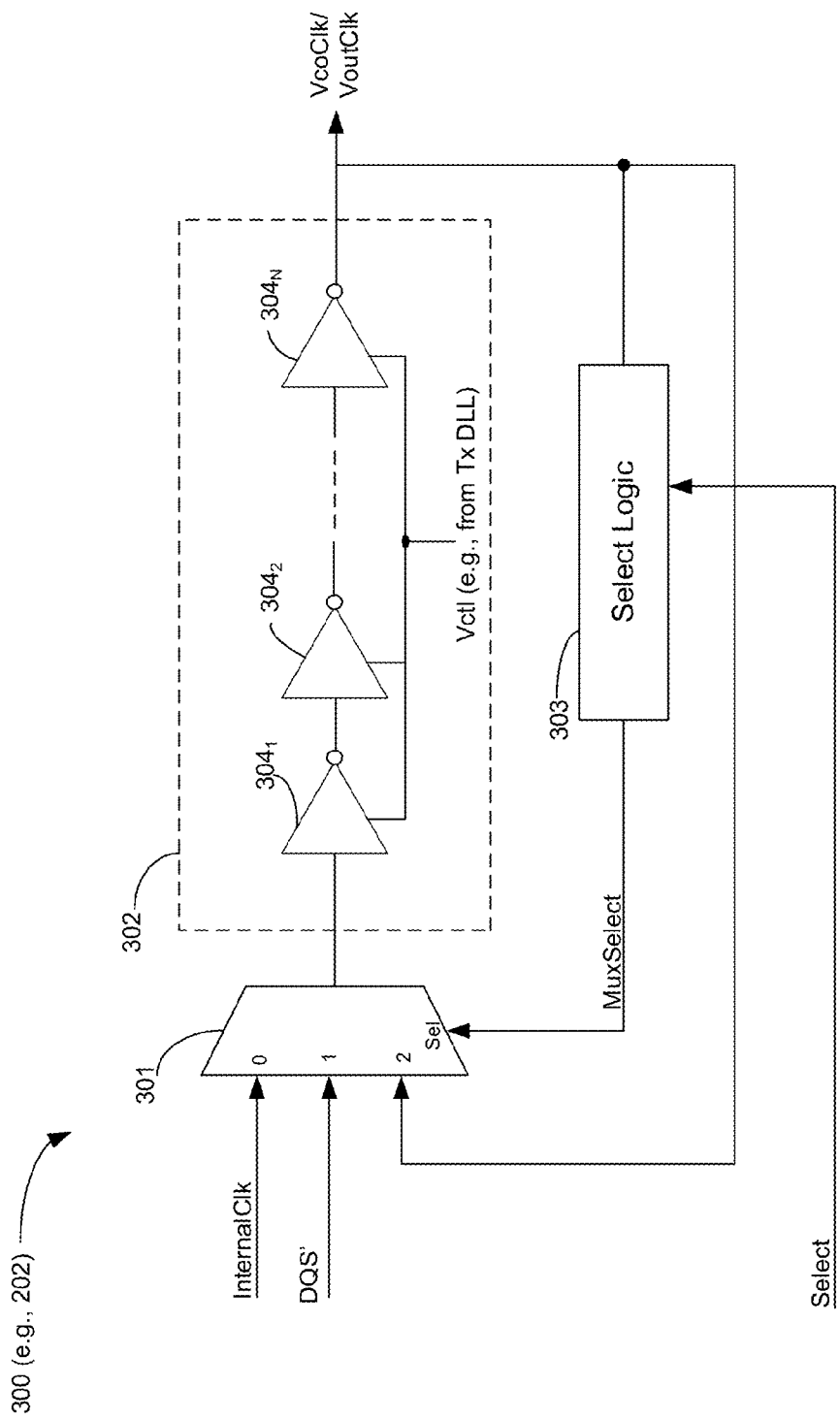
FIG. 3 illustrates a reconfigurable clocking circuit of the clocking path of the RX, according to some embodiments of the disclosure.

FIG. 3 illustrates a reconfigurable clocking circuit 300/ 202 of the clocking path 200 of receiver 102, according to some embodiments of the disclosure. It is pointed out that those elements of FIG. 3 having the same reference numbers (or names) as the elements of any other figure can operate or function in any manner similar to that described, but are not limited to such.

In some embodiments, reconfigurable clocking circuit 300/202 comprises multiplexer 301, delay line 302, and Select Logic 303. In some embodiments, multiplexer 301 is operable to select one of Internal clock (InternalClk), DQS'/ DQS'_b (e.g., amplified version of clock from memory 101), and VcoClk (e.g., output of delay line 302) according to the value of MuxSelect bus. In some embodiments, MuxSelect bus is a two bit bus which can provide at least three selections (e.g., 0, 1, and 2) for Multiplexer 301.

In some embodiments, delay line 302 is a voltage controlled delay line (VCDL) having a plurality of delay stages 304$_{1-N}$, where 'N' is an integer. In some embodiments, the delay stages are inverters. In other embodiments, the delay stages 304$_{1-N}$ are voltage controlled buffers having a propagation delay that depends on the voltage Vctl. In some embodiments, the reconfigurable RX clock is slaved off a transmitter (TX) delay-locked loop (DLL) clock. For example, the propagation delay of the VCDL path of delay line 302 is controlled by a control voltage (Vctl) generated by the TX. Any suitable voltage controlled delay line may be used for implementing delay line 302. In some embodiments, the output of Multiplexer 301 is received by delay line 302 which provides a delayed version of output as VcoClk. In some embodiments, delay line 302 is used as an open loop delay line. For example, the output VcoClk is not fed back as input to delay line 302. In some embodiments, delay line 302 is used in a closed loop. For example, the output VcoClk is fed back as input to delay line 302.

In some embodiments, Select Logic 303 receives Select signal from Logic 106. In some embodiments, Select Logic 303 is integrated within Logic 106. In some embodiments, Select Logic 303 is operable to configure Multiplexer 301 and delay line 302 as a ring oscillator or voltage controlled oscillator (VCO). For example, when Select signal from Logic 106 indicates that DQS is absent, then Select Logic 303 causes Multiplexer 301 to select input 0 or 2. When input 2 is selected, the output VcoClk is selected by Multiplexer 301 which is provided as input to delay line 302. As such, a ring oscillator is formed and VcoClk is the preconditioned clock provided by reconfigurable clocking circuit 300/202.

In some embodiments, when DQS arrives at the interface of IC 102, then Logic 106 instructs Multiplexer 301 via Select Logic 303 to select DQS' as input to delay line 302. In this example, delay line 302 is used in open loop configuration and VcoClk is the delayed version of DQS'. In some embodiments, when Select signal from Logic 106 indicates that DQS is absent, then Select Logic 303 causes Multiplexer 301 to select input 0. In this example, delay line 302 is used in an open loop configuration and VcoClk is the delayed version of InternalClk. Here, open loop configuration generally refers to a non-feedback electrical path for a signal. In some embodiments, InternalClk is generated by TX DLL clock, or any other internal clocking source to IC 102.

In some embodiments, when data from memory 101 is to be read (and a read command is issued), Logic 106 instructs Select Logic 303 to cause Multiplexer 301 to either select InternalClk as input to delay line 302 or VcoClk as input to delay line 302. In some embodiments, upon first transition of DQS from high to low, Logic 106 instructs Select Logic 303 to select DQS' as input to delay line 302. In this case, VcoClk is the delayed version of DQS'.

In some embodiments, Select Logic 303 is operable to configure reconfigurable clocking circuit 300/202 as a multiplying delay locked loop (MDLL). In some embodiments, Logic 106 monitors the frequency of DQS and selects one of inputs 0, 1, or 2 of Multiplexer to be provided as input to delay line 302.

In some embodiments, when Logic 106 determines that DQS is ready and available, but of slower frequency (e.g., 1.6 GHz), then Logic 106 causes Select Logic 303 to operate reconfigurable clocking circuit 300/202 as a MDLL to generate clock VcoClk. In this case, VcoClk has a higher frequency than the slower DQS. MDLL configuration can be used to increase the frequency of VcoClk relative to DQS' when DQS has a lower frequency than expected.

For example, if the expected frequency of DQS is 3.2 GHz but memory 101 provides DQS with 1.6 GHz frequency, then Logic 106 instructs Select Logic 303 to operate reconfigurable clocking circuit 300/202 as an MDLL so that the data path that samples DQ using VcoClk (i.e., RClk) continues to sample DQ with a 3.2 GHz sampling rate. In some embodiments, when Logic 106 determines that DQS is ready and available, and of expected frequency (e.g., 3.2 GHz), then Logic 106 causes Select Logic 303 to operate reconfigurable clocking circuit 300/202 as a delay line (e.g., in an open loop configuration). For example, Multiplexer 301 causes DQS' to be provided as input to delay line 302.

Figure 4:
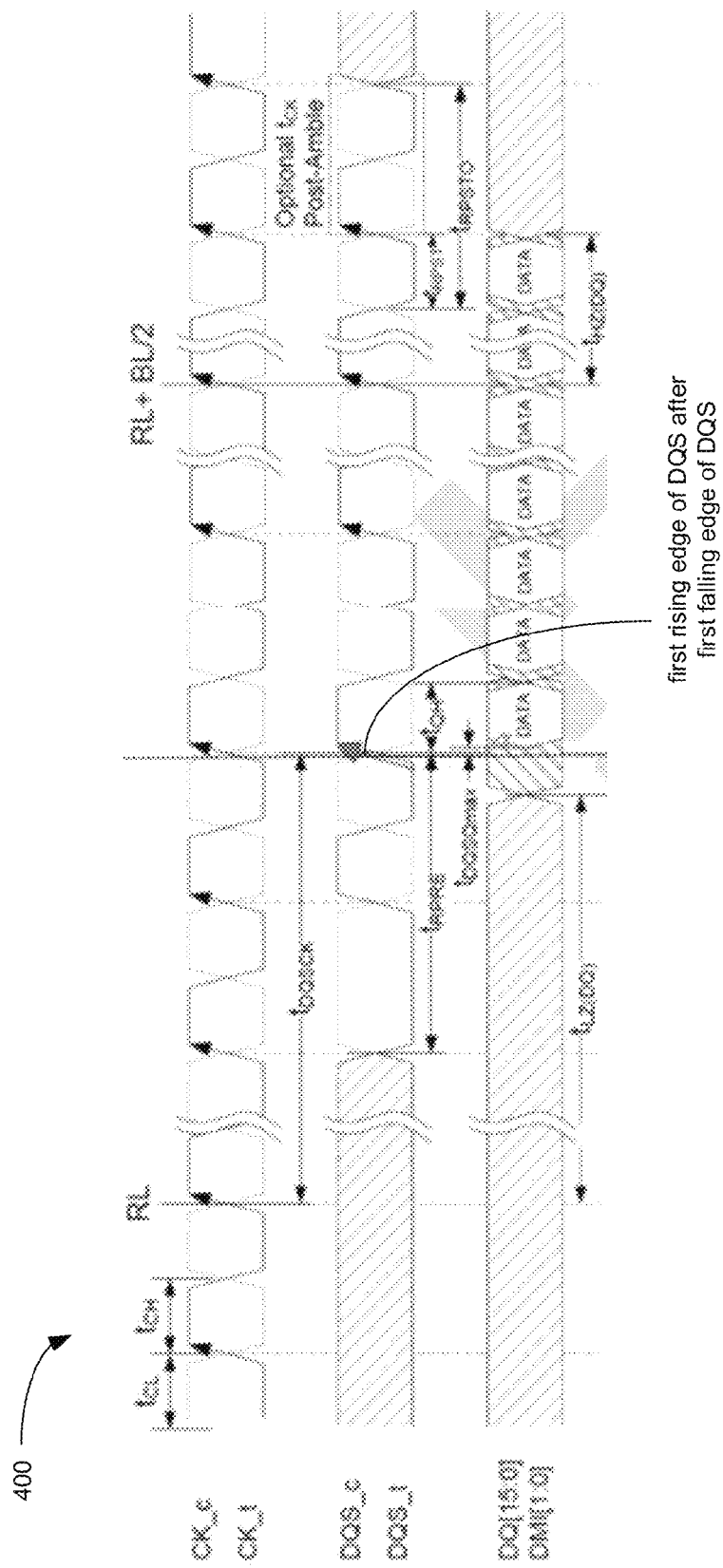
FIG. 4 illustrates a timing diagram of a matched RX architecture.

FIG. 4 illustrates timing diagram 400 of a matched receiver architecture.

Here, x-axis is time and y-axis for each signal is voltage or logic level. In timing diagram 400, three pairs of signals are shown. The first pair of signals are differential clock signals CK_c and CK_t of a receiver; the second pair of signals are differential strobe signals DQS_c and DQS_t, and the third pair of signals are differential data signals DQ (e.g., 16 bit data signal).

Here, $t_{CL}$ is the duration of low phase of CK_t/c, $t_{CH}$ is the duration of high phase of CK_t/c, $t_{DQSCK}$ is the access time of DQS from the time RL (read latency) asserts to when first rising edge of DQS_c/t is detected after the first falling edge of DQS_c/t, $t_{RPRE}$ is the preamble duration indicating when DQS_c/t arrives and when it is ready to be used as a sampling clock for sampling data DQ, $t_{RPRE}$ may also be the time duration DQS starts toggling (e.g., DQS is no longer in tri-state) before DQS is ready, DMI is Data Mask Inversion (e.g., 2 bits), and BL is burst length. DMI is a bi-directional signal which is driven HIGH when the data on the data bus is inverted, or driven LOW when the data is in its normal state. Data inversion can be disabled via a mode register setting.

In a conventional matched RX architecture, when RL (e.g., a handshake signal coming from memory 101 to inform the receiver that strobe DQS is absent but about to arrive) is received by a receiver, the receiver waits for the first rising edge of DQS after the first falling edge of DQS to begin sampling DQ. Since DQ and DQS paths are matched, the DQ will be sampled upon DQS arrival with no additional data preamble.

Figure 5:
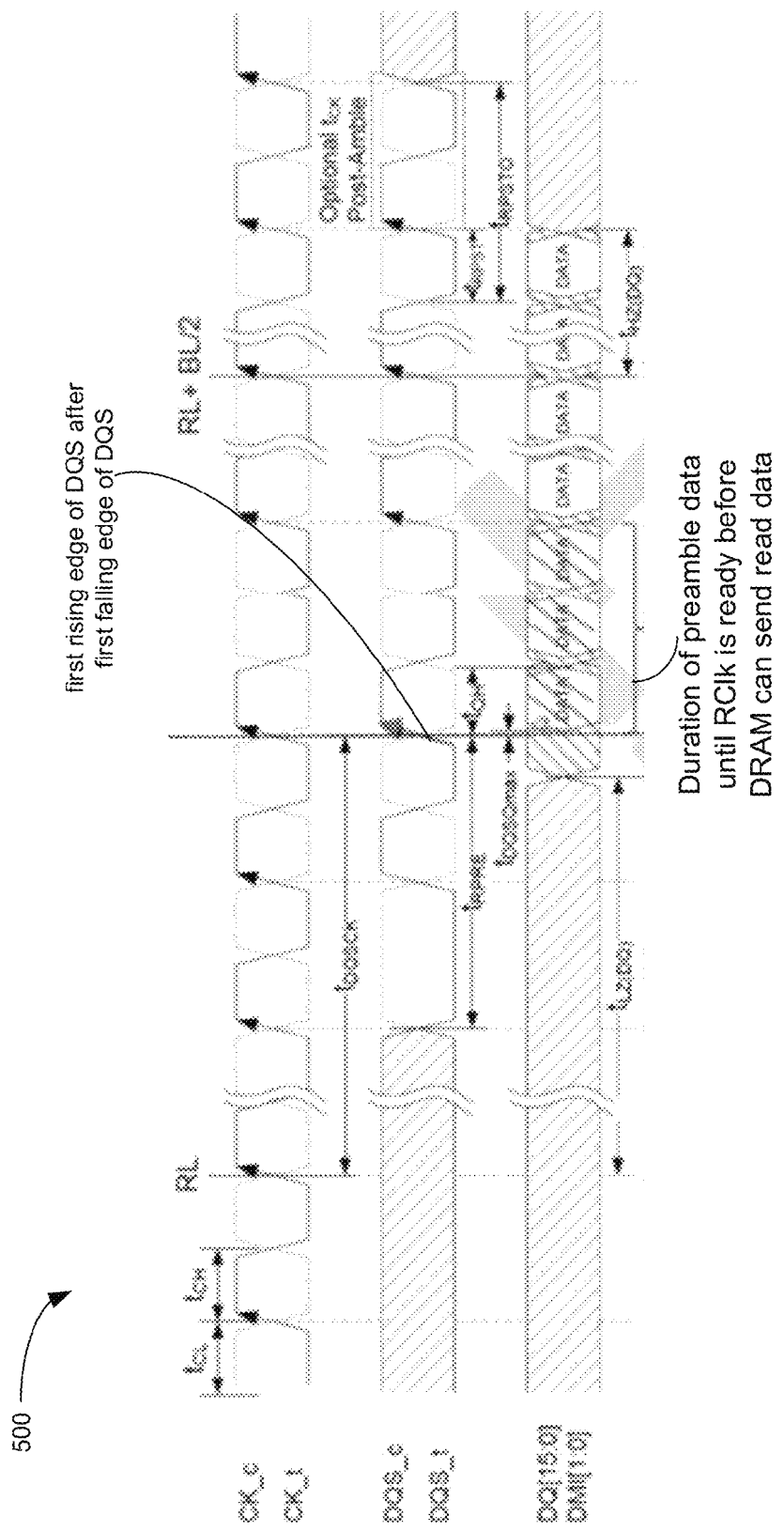
FIG. 5 illustrates a timing diagram of an unmatched RX architecture.

FIG. 5 illustrates timing diagram 500 of a conventional un-matched receiver architecture. It is pointed out that those elements of FIG. 5 having the same reference numbers (or names) as the elements of any other figure can operate or function in any manner similar to that described, but are not limited to such.

In an un-matched sensitive RX architecture, when RL (e.g., a handshake signal coming from memory 101 to inform the receiver that strobe DQS is absent but about to arrive) is received by a receiver, preamble data (e.g., three unit intervals) are sent before the actual DQ can be sent. As such, a conventional un-matched sensitive RX architecture incurs an additional read latency before DQS is available to sample DQ. For example, since the DQS path is longer than the DQ path (e.g., by three unit intervals), the preamble data needs to be sent for greater than three unit intervals until RX clock is ready at the data sampler. When the clock path is driven with LDO 103, additional read latency incurs as data preamble has to be sent for the duration of time LDO output is stabilized.

Figure 6:
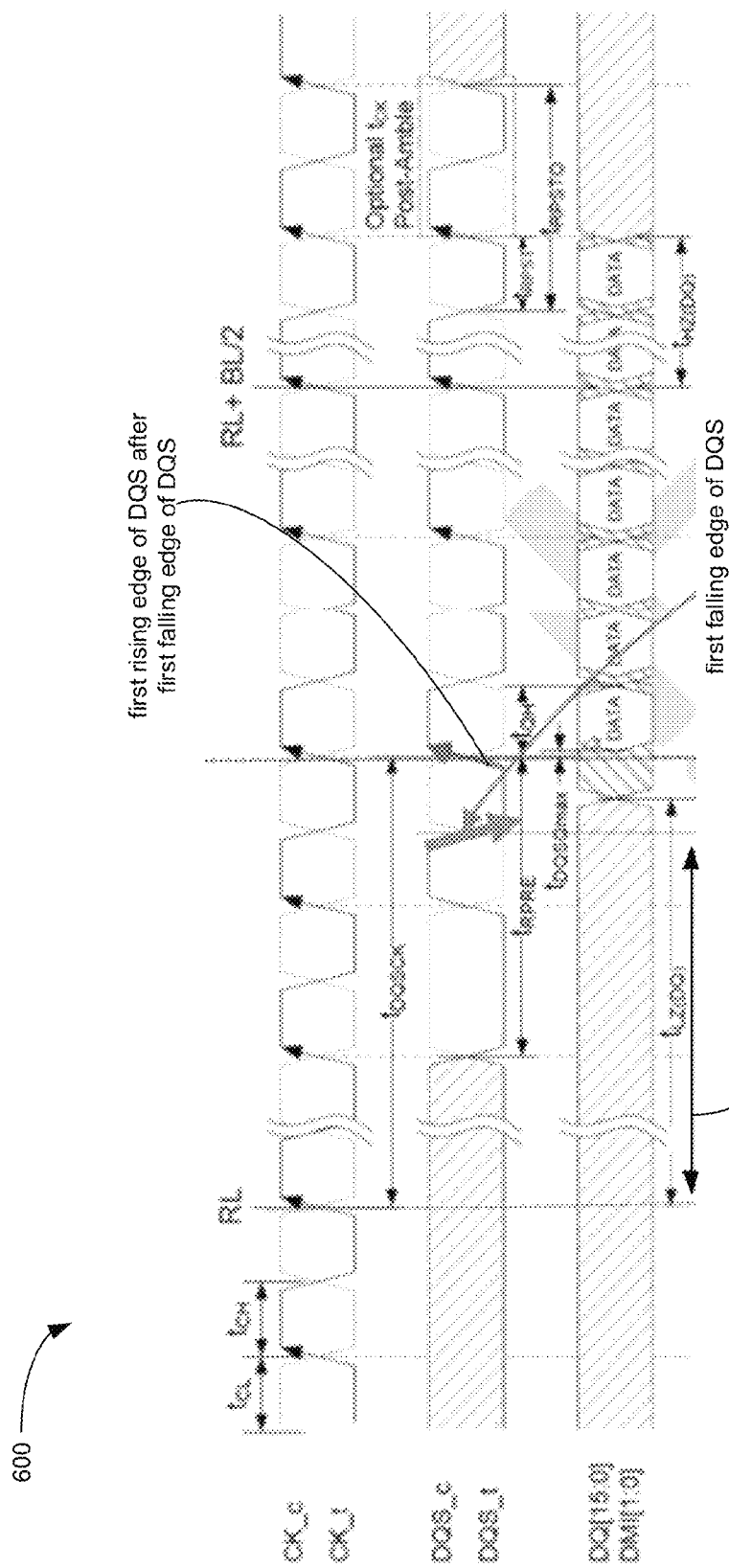
FIG. 6 illustrates a timing diagram of an unmatched RX with the reconfigurable clocking architecture, according to some embodiments of the disclosure.

FIG. 6 illustrates timing diagram 600 of the unmatched sensitive RX with reconfigurable clocking architecture, according to some embodiments of the disclosure. It is pointed out that those elements of FIG. 6 having the same reference numbers (or names) as the elements of any other figure can operate or function in any manner similar to that described, but are not limited to such.

In an unmatched sensitive RX architecture, when RL (e.g., a handshake signal coming from memory 101 to inform the receiver that strobe DQS is absent but about to arrive) is received by IC 102, Logic 106 (via Select Logic 303) causes Multiplexer 301 to select inputs '0' or '2'. In this case, RClk is one of InternalClk or ring oscillator clock. As such, RClk is preconditioned so that the receiver of IC 102 is ready to sample DQ as soon as DQS is ready.

When the first falling edge of DQS is detected by Logic 106, Logic 106 (via Select Logic 303) causes Multiplexer 301 to select input '1' so that DQS' is provided as input to delay line 302. Upon the next rising edge of DQS, data DQ is sampled. Compared to the conventional unmatched RX architecture, the reconfigurable clocking architecture of various embodiments when used in the unmatched RX architecture prepares the RX clock path before DQS arrival and this removes the read latency inherent in the conventional unmatched RX architecture. In the unmatched sensitive RX architecture of IC 102, data read performance is similar to the matched RX case and has reduced read latency compared to the conventional unmatched Receiver discussed with reference to FIG. 5.

Figure 7:
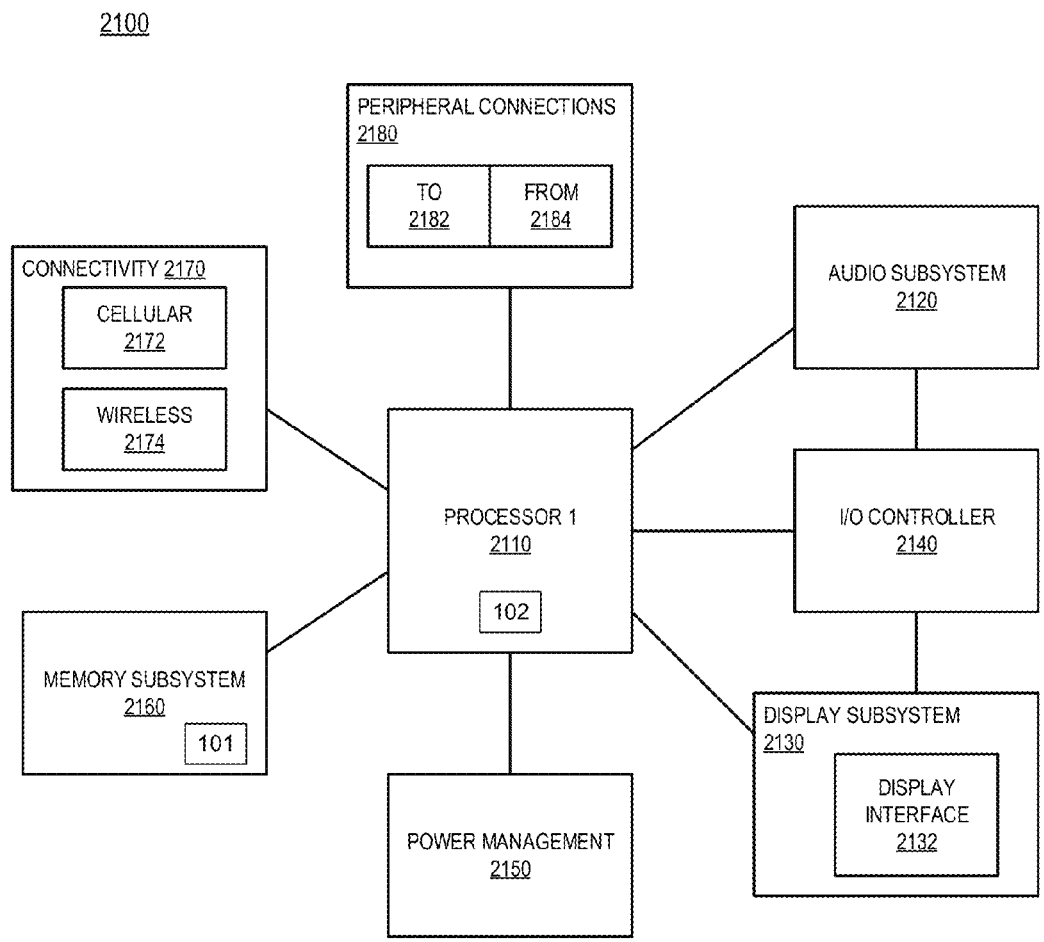
FIG. 7 illustrates a smart device or a computer system or a SoC (System-on-Chip) having a reconfigurable clocking architecture, according to some embodiments.

FIG. 7 illustrates a smart device or a computer system or a SoC (System-on-Chip) having a reconfigurable clocking architecture, according to some embodiments. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with reconfigurable clocking architecture 102, according to some embodiments discussed. Other blocks of the computing device 2100 may also include the reconfigurable clocking architecture 102 of some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. Memory 2150 may include memory 101.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a comparator to be clocked by a clock signal to be provided by a clocking circuit, wherein the clocking circuit includes: a voltage controlled delay line having two or more delay cells; a multiplexer coupled to the voltage controlled delay line and operable to configure the clocking circuit as a ring oscillator with the voltage controlled delay line forming at least one delay section of the ring oscillator; and select logic coupled to the multiplexer, wherein the select logic is to receive a signal indicating arrival of an input clock, and is to control the multiplexer according to the indication.

In some embodiments, apparatus comprises a low-dropout (LDO) regulator which is to receive an input power supply and is to provide an output power supply to the clocking circuit. In some embodiments, the multiplexer is to receive another clock signal and is to provide the other clock signal to the comparator according to the indication. In some embodiments, the two or more delay cells of the voltage controlled delay line are to receive a control voltage from a transmitter. In some embodiments, the clocking circuit comprises an amplifier to receive the input clock and to provide an amplified version of the input clock to a first input of the multiplexer, and wherein a second input of the multiplexer is to receive an output of the voltage controlled delay line.

In some embodiments, the select logic is to control the multiplexer according to one or more conditions. In some embodiments, the one or more conditions include: frequency of the input clock and ready state of the input clock. In some embodiments, the select logic is to configure the multiplexer and the voltage controlled delay line to form the ring oscillator until a falling edge of the input clock is detected, thereafter the select logic is to configure the multiplexer and the voltage controlled delay line to form an open loop delay line to provide a delayed version of the input clock.

In some embodiments, the clocking circuit comprises a phase interpolator coupled to the voltage controlled delay line. In some embodiments, the clocking circuit comprises a per-bit de-skewing circuit coupled to the phase interpolator. In some embodiments, the clocking circuit comprises a clock distribution circuit coupled to the per-bit de-skewing circuit, and wherein the clock distribution circuit is to provide the clock signal to the comparator.

In another example, an apparatus is provided which comprises: a data path to receive input data; and a clock path to receive an input clock and to provide a preconditioned clock to the data path when the input clock is absent. In some embodiments, the apparatus a low-dropout (LDO) regulator which is to receive an input power supply and to provide an output power supply to the clock path. In some embodiments, the data path includes: a sample-and-hold circuit; a strong-arm latch coupled to the sample-and-hold circuit; and a set-reset latch coupled to the strong-arm latch.

In some embodiments, the clock path comprises: a phase interpolator; a voltage controlled delay line coupled to the phase interpolator; a multiplexer having a first input and a second input; an amplifier to receive the input clock and to provide an amplified version of the input clock to the first input of the multiplexer, wherein the second input of the multiplexer is to receive an output of the voltage controlled delay line; and a select logic to control the multiplexer according to one or more conditions.

In some embodiments, the one or more conditions include: a frequency of the input clock and a ready state of the input clock. In some embodiments, the select logic is to configure the multiplexer and the voltage controlled delay line to form a ring oscillator to provide the preconditioned clock until a falling edge of the input clock is detected, thereafter the select logic is to configure the multiplexer and the voltage controlled delay line to form an open loop delay line to provide a delayed version of the input clock. In some embodiments, the clock path comprises a clock distribution circuit which is to provide the preconditioned clock to the data path.

In another example, a system is provided which comprises: a Dynamic Random Access Memory (DRAM); an integrated circuit (IC) coupled to the DRAM, the IC including: a receiver including a comparator to be clocked by a clock signal to be provided by a clocking circuit, wherein the clocking circuit includes: a voltage controlled delay line having two or more delay cells; a multiplexer coupled to the voltage controlled delay line and operable to configure the clocking circuit as a ring oscillator with the voltage controlled delay line forming at least one delay section of the ring oscillator; and select logic coupled to the multiplexer, the select logic is to receive a signal indicating arrival of an input clock, and is to control the multiplexer according to the indication; and a wireless interface for allowing the processor to communicate with another device.

In some embodiments, the IC comprises a low-dropout (LDO) regulator which is to receive an input power supply and to provide an output power supply to the clocking circuit. In some embodiments, the multiplexer is to receive another clock signal and is to provide the other clock signal to the comparator according to the indication. In some embodiments, the two or more delay cells of the voltage controlled delay line are to receive a control voltage from a transmitter. In some embodiments, the clocking circuit comprises an amplifier to receive the input clock and to provide an amplified version of the input clock to a first input of the multiplexer, and wherein a second input of the multiplexer is to receive an output of the voltage controlled delay line.

In some embodiments, the select logic is to control the multiplexer according to one or more conditions. In some embodiments, the one or more conditions include: frequency of the input clock and ready state of the input clock. In some embodiments, the select logic is to configure the multiplexer and the voltage controlled delay line to form the ring oscillator until a falling edge of the input clock is detected, thereafter the select logic is to configure the multiplexer and the voltage controlled delay line to form an open loop delay line to provide a delayed version of the input clock. In some embodiments, the clocking circuit comprises a phase interpolator coupled to the voltage controlled delay line. In some embodiments, the clocking circuit comprises a per-bit de-skewing circuit coupled to the phase interpolator. In some embodiments, the clocking circuit comprises a clock distribution circuit coupled to the per-bit de-skewing circuit, and wherein the clock distribution circuit is to provide the clock signal to the comparator.

In another example, a system is provided which comprises: a Dynamic Random Access Memory (DRAM); an integrated circuit (IC) coupled to the DRAM, the IC including: a receiver which comprises: a data path to receive input data; and a clock path to receive an input clock and to provide a preconditioned clock to the data path when the input clock is absent; and a wireless interface for allowing the processor to communicate with another device.

In some embodiments, the receiver comprises a low-dropout (LDO) regulator which is to receive an input power supply and to provide an output power supply to the clock path. In some embodiments, the data path includes: a sample-and-hold circuit; a strong-arm latch coupled to the sample-and-hold circuit; and a set-reset latch coupled to the strong-arm latch. In some embodiments, the clock path comprises: a phase interpolator; a voltage controlled delay line coupled to the phase interpolator; a multiplexer having a first input and a second input; an amplifier to receive the input clock and to provide an amplified version of the input clock to the first input of the multiplexer, wherein the second input of the multiplexer is to receive an output of the voltage controlled delay line; and a select logic to control the multiplexer according to one or more conditions.

In some embodiments, the one or more conditions include: a frequency of the input clock and a ready state of the input clock. In some embodiments, the select logic is to configure the multiplexer and the voltage controlled delay line to form a ring oscillator to provide the preconditioned clock until a falling edge of the input clock is detected, thereafter the select logic is to configure the multiplexer and the voltage controlled delay line to form an open loop delay line to provide a delayed version of the input clock. In some embodiments, the clock path comprises a clock distribution circuit which is to provide the preconditioned clock to the data path.

In another example, a method is provided which comprises: receiving input data by a data path; receiving a clock by a clock path; providing a preconditioned clock to the data path when the input clock is absent. In some embodiments, the method receiving an input power supply and providing an output power supply to the clock path. In some embodiments, the data path includes: a sample-and-hold circuit; a strong-arm latch coupled to the sample-and-hold circuit; and a set-reset latch coupled to the strong-arm latch. In some embodiments, the clock path comprises: a phase interpolator; a voltage controlled delay line coupled to the phase interpolator; and a multiplexer having a first input and a second input, wherein the method comprises: receiving the input clock; and amplifying the input clock; providing the amplified input clock to the multiplexer; providing an output of the voltage controlled delay line to the multiplexer; and controlling the multiplexer according to one or more conditions.

In some embodiments, the one or more conditions include: a frequency of the input clock and a ready state of the input clock. In some embodiments, the method comprises: configuring the multiplexer and the voltage controlled delay line to form a ring oscillator; and providing the preconditioned clock until a falling edge of the input clock is detected, thereafter configuring the multiplexer and the voltage controlled delay line to form an open loop delay line to provide a delayed version of the input clock. In some embodiments, the method comprises providing preconditioned clock to the data path.

In another example, an apparatus means for receiving input data by a data path; means for receiving a clock by a clock path; means for providing a preconditioned clock to the data path when the input clock is absent. In some embodiments, the apparatus comprises means for receiving an input power supply and means for providing an output power supply to the clock path. In some embodiments, the data path includes: a sample-and-hold circuit; a strong-arm latch coupled to the sample-and-hold circuit; and a set-reset latch coupled to the strong-arm latch.

In some embodiments, the clock path comprises: a phase interpolator; a voltage controlled delay line coupled to the phase interpolator; and a multiplexer having a first input and a second input, wherein the apparatus comprises: means for receiving the input clock; means for amplifying the input clock; means for providing the amplified input clock to the multiplexer; means for providing an output of the voltage controlled delay line to the multiplexer; and means for controlling the multiplexer according to one or more conditions.

In some embodiments, the one or more conditions include: a frequency of the input clock and a ready state of the input clock. In some embodiments, the apparatus comprises: means for configuring the multiplexer and the voltage controlled delay line to form a ring oscillator; and means for providing the preconditioned clock until a falling edge of the input clock is detected, thereafter configuring the multiplexer and the voltage controlled delay line to form an open loop delay line to provide a delayed version of the input clock. In some embodiments, the apparatus comprises means for providing preconditioned clock to the data path.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a comparator to be clocked by a clock signal to be provided by a clocking circuit, wherein the clocking circuit includes:
      a voltage controlled delay line having two or more delay cells;
      a multiplexer coupled to the voltage controlled delay line and operable to configure the clocking circuit as a ring oscillator with the voltage controlled delay line forming at least one delay section of the ring oscillator; and
      select logic coupled to the multiplexer, wherein the select logic is to receive a signal indicating arrival of an input clock, and is to control the multiplexer according to the indication.

2. The apparatus of claim 1 comprises a low-dropout (LDO) regulator which is to receive an input power supply and is to provide an output power supply to the clocking circuit.

3. The apparatus of claim 1, wherein the multiplexer is to receive another clock signal and is to provide the other clock signal to the comparator according to the indication.

4. The apparatus of claim 1, wherein the two or more delay cells of the voltage controlled delay line are to receive a control voltage from a transmitter.

5. The apparatus of claim 1, wherein the clocking circuit comprises an amplifier to receive the input clock and to provide an amplified version of the input clock to a first input of the multiplexer, and wherein a second input of the multiplexer is to receive an output of the voltage controlled delay line.

6. The apparatus of claim 1, wherein the select logic is to control the multiplexer according to one or more conditions.

7. The apparatus of claim 6, wherein the one or more conditions include: frequency of the input clock and ready state of the input clock.

8. The apparatus of claim 6, wherein the select logic is to configure the multiplexer and the voltage controlled delay line to form the ring oscillator until a falling edge of the input clock is detected, thereafter the select logic is to configure the multiplexer and the voltage controlled delay line to form an open loop delay line to provide a delayed version of the input clock.

9. The apparatus of claim 1, wherein the clocking circuit comprises a phase interpolator coupled to the voltage controlled delay line.

10. The apparatus of claim 9, wherein the clocking circuit comprises a per-bit de-skewing circuit coupled to the phase interpolator.

11. The apparatus of claim 10, wherein the clocking circuit comprises a clock distribution circuit coupled to the per-bit de-skewing circuit, and wherein the clock distribution circuit is to provide the clock signal to the comparator.

12. An apparatus comprising:
a data path to receive input data; and
a clock path to receive an input clock and to provide a preconditioned clock to the data path when the input clock is absent.

13. The apparatus of claim 12 comprises a low-dropout (LDO) regulator which is to receive an input power supply and to provide an output power supply to the clock path.

14. The apparatus of claim 12, wherein the data path includes:
a sample-and-hold circuit;
a strong-arm latch coupled to the sample-and-hold circuit; and
a set-reset latch coupled to the strong-arm latch.

15. The apparatus of claim 12, wherein the clock path comprises:
a phase interpolator;
a voltage controlled delay line coupled to the phase interpolator;
a multiplexer having a first input and a second input;
an amplifier to receive the input clock and to provide an amplified version of the input clock to the first input of the multiplexer, wherein the second input of the multiplexer is to receive an output of the voltage controlled delay line; and
a select logic to control the multiplexer according to one or more conditions.

16. The apparatus of claim 15, wherein the one or more conditions include: a frequency of the input clock and a ready state of the input clock.

17. The apparatus of claim 15, wherein the select logic is to configure the multiplexer and the voltage controlled delay line to form a ring oscillator to provide the preconditioned clock until a falling edge of the input clock is detected, thereafter the select logic is to configure the multiplexer and the voltage controlled delay line to form an open loop delay line to provide a delayed version of the input clock.

18. The apparatus of claim 15, wherein the clock path comprises a clock distribution circuit which is to provide the preconditioned clock to the data path.

19. A system comprising:
a Dynamic Random Access Memory (DRAM);
an integrated circuit (IC) coupled to the DRAM, the IC including:
a receiver including a comparator to be clocked by a clock signal to be provided by a clocking circuit, wherein the clocking circuit includes:
a voltage controlled delay line having two or more delay cells;
a multiplexer coupled to the voltage controlled delay line and operable to configure the clocking circuit as a ring oscillator with the voltage controlled delay line forming at least one delay section of the ring oscillator; and
select logic coupled to the multiplexer, the select logic is to receive a signal indicating arrival of an input clock, and is to control the multiplexer according to the indication; and
a wireless interface for allowing the processor to communicate with another device.

20. The system of claim 19, wherein the IC comprises a low-dropout (LDO) regulator which is to receive an input power supply and to provide an output power supply to the clocking circuit.

21. An apparatus comprising:
a voltage controlled delay line having two or more delay cells; and
a multiplexer coupled to the voltage controlled delay line and operable to configure a clocking circuit as a ring oscillator with the voltage controlled delay line forming at least one delay section of the ring oscillator.

22. The apparatus of claim 21 comprises select logic coupled to the multiplexer, wherein the select logic is to receive a signal indicating arrival of an input clock, and is to control the multiplexer according to the indication.

23. The apparatus of claim 22, wherein the select logic is to cause the multiplexer and the voltage controlled delay line to form the ring oscillator until a falling edge of the input clock is detected.

24. The apparatus of claim 22, wherein the select logic is to cause the multiplexer and the voltage controlled delay line to form an open loop delay line to provide a delayed version of the input clock.

* * * * *